(12) United States Patent
Bayerer et al.

(10) Patent No.: US 8,593,817 B2
(45) Date of Patent: Nov. 26, 2013

(54) POWER SEMICONDUCTOR MODULE AND METHOD FOR OPERATING A POWER SEMICONDUCTOR MODULE

(75) Inventors: Reinhold Bayerer, Warstein (DE); Thilo Stolze, Arnsberg (DE)

(73) Assignee: Infineon Technologies AG, Neubiberg (DE)

( * ) Notice: Subject to any disclaimer, the term of this patent is extended or adjusted under 35 U.S.C. 154(b) by 294 days.

(21) Appl. No.: 12/894,758

(22) Filed: Sep. 30, 2010

(65) Prior Publication Data

US 2011/0075451 A1    Mar. 31, 2011

(30) Foreign Application Priority Data

Sep. 30, 2009    (DE) .......................... 10 2009 045 181

(51) Int. Cl.
*H05K 7/00*    (2006.01)
(52) U.S. Cl.
USPC ........... 361/729; 361/104; 361/202; 361/702; 361/704; 361/820; 174/529; 174/535; 174/564; 438/15; 438/106; 438/108; 438/125; 428/189; 257/678; 257/680; 257/691; 257/703; 257/723; 257/724; 257/739; 257/742; 257/762; 257/772; 257/777
(58) Field of Classification Search
USPC ......... 361/729, 104, 202, 702, 704, 820, 728, 361/725; 174/529, 535, 564; 438/15, 106, 438/108, 125; 428/189; 257/678, 680, 691, 257/703, 723, 724, 739, 742, 762, 772, 257/777; 16/50, 221, 223, 280, 317, 330, 16/334, 337, 341, 348, 367; 439/11, 373, 439/640; 455/575.1, 575.3; 348/335, 375
See application file for complete search history.

(56) References Cited

U.S. PATENT DOCUMENTS

| | | | | | |
|---|---|---|---|---|---|
| 3,349,296 | A | * | 10/1967 | Hubert | 257/739 |
| 3,716,759 | A | * | 2/1973 | Scace et al. | 361/704 |
| 5,015,803 | A | * | 5/1991 | Mahulikar et al. | 174/529 |
| 5,492,842 | A | * | 2/1996 | Eytcheson et al. | 438/15 |
| 5,530,284 | A | | 6/1996 | Baileu | |
| 5,539,254 | A | * | 7/1996 | Eytcheson et al. | 257/691 |
| 5,904,499 | A | * | 5/1999 | Pace | 438/108 |
| 6,165,820 | A | * | 12/2000 | Pace | 438/125 |
| 6,329,714 | B1 | * | 12/2001 | Guillot | 257/723 |
| 6,541,859 | B1 | * | 4/2003 | Forbes et al. | 257/742 |
| 6,617,963 | B1 | * | 9/2003 | Watters et al. | 340/10.41 |
| 6,806,808 | B1 | * | 10/2004 | Watters et al. | 340/10.41 |
| 7,235,810 | B1 | * | 6/2007 | Yamazaki et al. | 257/59 |
| 2001/0014487 | A1 | * | 8/2001 | Guillot | 438/106 |
| 2004/0104460 | A1 | * | 6/2004 | Stark | 257/678 |
| 2004/0188124 | A1 | * | 9/2004 | Stark | 174/52.3 |
| 2004/0210289 | A1 | * | 10/2004 | Wang et al. | 607/116 |
| 2004/0227231 | A1 | * | 11/2004 | Maly et al. | 257/724 |
| 2004/0228094 | A1 | * | 11/2004 | Ahmed et al. | 361/702 |

(Continued)

FOREIGN PATENT DOCUMENTS

| | | |
|---|---|---|
| DE | 10 2004 059 389 A1 | 6/2006 |
| DE | 10 2007 046 021 A1 | 5/2008 |
| DE | 10 2007 046 556 A1 | 4/2009 |

*Primary Examiner* — Xiaoliang Chen
(74) *Attorney, Agent, or Firm* — Murphy, Bilak & Homiller, PLLC

(57) ABSTRACT

A power semiconductor module is provided in which power semiconductor chips with an aluminum-based chip metallization and power semiconductor chips with a copper-based chip metallization are included in the same module, and operated at different barrier-layer temperatures during use.

25 Claims, 10 Drawing Sheets

(56) References Cited

U.S. PATENT DOCUMENTS

| | | | |
|---|---|---|---|
| 2005/0029666 A1* | 2/2005 | Kurihara et al. | 257/772 |
| 2005/0069266 A1* | 3/2005 | Kouta et al. | 385/92 |
| 2005/0230678 A1* | 10/2005 | Cao et al. | 257/40 |
| 2005/0275079 A1* | 12/2005 | Stark | 257/680 |
| 2006/0157274 A1* | 7/2006 | Stark | 174/564 |
| 2006/0187608 A1* | 8/2006 | Stark | 361/202 |
| 2006/0191215 A1* | 8/2006 | Stark | 52/204.6 |
| 2006/0267721 A1* | 11/2006 | Graf et al. | 337/297 |
| 2006/0267722 A1* | 11/2006 | Graf et al. | 337/297 |
| 2006/0268645 A1* | 11/2006 | Graf et al. | 365/225.7 |
| 2006/0274561 A1* | 12/2006 | Ahmed et al. | 363/132 |
| 2007/0236849 A1* | 10/2007 | Bono et al. | 361/104 |
| 2007/0281401 A1* | 12/2007 | Yamazaki et al. | 438/151 |
| 2008/0048342 A1* | 2/2008 | Cheah et al. | 257/777 |
| 2008/0073792 A1* | 3/2008 | Hosseini et al. | 257/762 |
| 2008/0081157 A1* | 4/2008 | Schneegans et al. | 428/189 |
| 2008/0093729 A1* | 4/2008 | Siepe et al. | 257/703 |
| 2009/0058350 A1 | 3/2009 | Wei et al. | |
| 2009/0085215 A1 | 4/2009 | Stecher | |
| 2009/0109645 A1* | 4/2009 | Kreutzer et al. | 361/820 |

* cited by examiner

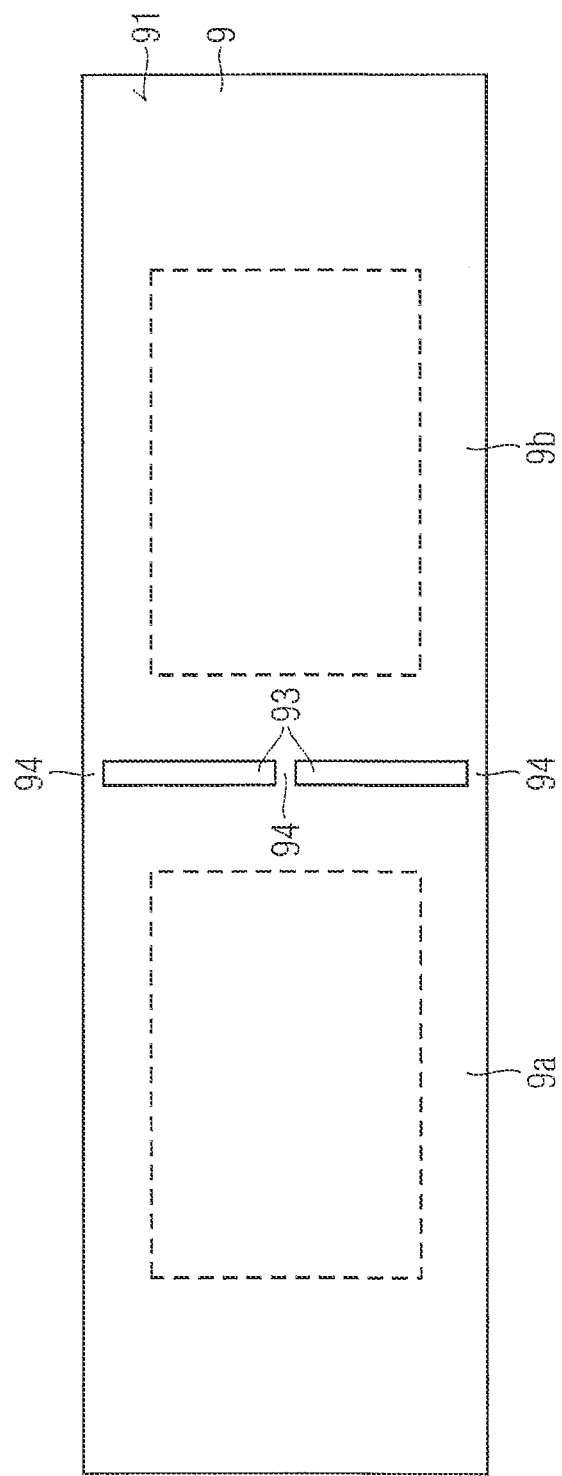

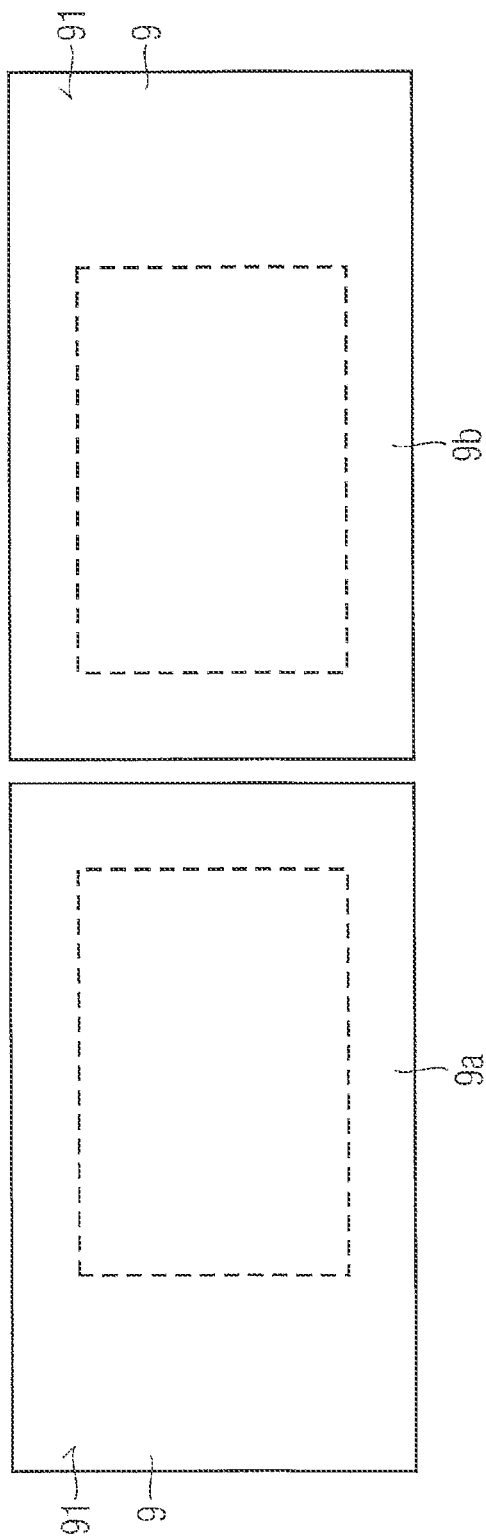

POWER SEMICONDUCTOR MODULE AND METHOD FOR OPERATING A POWER SEMICONDUCTOR MODULE

PRIORITY CLAIM

This application claims priority from German Patent Application No. 10 2009 045 181.1 filed on 30 Sep. 2009, said German Patent Application incorporated herein by reference in its entirety.

FIELD OF THE INVENTION

The present invention relates to power semiconductor modules, and particularly to power semiconductor modules that contain two or more power semiconductor chips, for example diodes, thyristors, IGBTs, MOSFETs, JFETs, etc.

BACKGROUND

Power semiconductor chips available today comprise a very wide spectrum of different chip technologies. In the past, the further development of rapidly switching power semiconductor chips has led to ever higher permissible barrier-layer temperatures, and consequently operating temperatures. It has consequently become necessary to replace conventional connecting techniques with which the power semiconductor chips are connected to other components of the power semiconductor module by improved connecting techniques that withstand higher temperatures. This applies all the more if the power semiconductor chips concerned are used in switching operation and, as a result, are exposed to great alternating temperature loading. However, such improved connecting techniques generally require special, expensive chip metallizations, for example with copper or precious metals. Furthermore, it may be necessary for the components of the module that are connected to such special chip metallizations, for example metallizations of ceramic substrates in which the power semiconductor chips are mounted, or bonding wires with which the power semiconductor chips are connected, also to meet increased requirements, which generally increases the costs.

The latest developments in chip metallization of power semiconductor chips are heading toward copper metallizations; the chip metallizations of conventional power semiconductor chips, on the other hand, predominantly consist of aluminum. Copper has the advantage over aluminum of an electrical conductivity that is approximately 50% higher. Furthermore, copper is particularly well-suited for the production of high-temperature-resistant diffusion soldering connections. However, copper is expensive and readily oxidizes. To produce a diffusion soldering connection, however, at least one blank copper surface is required, i.e. either the copper must be freed of an oxide film, for example, before the diffusion soldering, or else a blank copper surface must be protected from oxidation in the time period before the diffusion soldering, for example if the component concerned is to be stored for a relatively long time. However, all these measures are laborious and expensive.

Apart from diffusion soldering connections, low-temperature pressure sintering connections also have a high temperature resistance and alternating temperature resistance. Here, a paste, which contains silver powder and a solvent, is introduced between the components to be joined that are to be connected to one another. Then the components to be joined are pressed against one another under high pressure at a predetermined temperature for a predetermined time. This produces a connection that is resistant to high temperature and stable under changing temperatures. Apart from the fact that this production process as such is laborious and expensive, the surfaces of the components to be joined that are to be connected to one another must be coated with a precious metal, for example silver or gold, which likewise increases the costs.

A further conventional connecting technique is that of wire bonding. Here, a bonding wire is bonded, for example, onto an upper, freely accessible chip metallization. The bonding wires that are usually used for this purpose predominantly consist of aluminum. When operating under alternating loads with great temperature differences, however, the mechanical properties of aluminum deteriorate over time, and this is accompanied by a deterioration in the strength of the bonding connection. After being in operation for a relatively long time, this may cause the bonding wire to "lift off" from the chip metallization. As a difference from this, copper has much better properties when operated under alternating loads, for which reason copper-based bonding wires are increasingly being used. However, a high-quality wire bonding connection that is stable under changing temperatures requires that the hardness of the chip metallization and the hardness of the bonding wire do not differ too much. It is therefore advantageous from a technical viewpoint to use in the case of modern power semiconductor chips upper chip metallizations of copper, which however are expensive.

In the production of today's power semiconductor modules, a consistently applied electrical or mechanical connecting technique is used for production engineering reasons, which means that connections corresponding to one another of all the power semiconductor chips of the power semiconductor module are integrated in the module structure with the same connecting technique. The reason for this is that the same connecting technique is used for all comparable sub-steps in the production of a power semiconductor module to maintain an economic process.

For example, the underside metallizations of all the power semiconductor chips of the module may be soldered by means of a conventional fusion soldering connection, for example on metallized ceramic substrates, while the upper-side metallizations are respectively connected electrically by means of an aluminum bonding wire connection. If, however, modern, rapidly switching power semiconductor chips are fitted in the power semiconductor module with these connecting techniques, there is a high probability of failure of the power semiconductor module lying in the conventional connecting technique, since modern power semiconductor chips are usually operated over a greater temperature range than conventional power semiconductor chips.

As an alternative to the conventional connecting techniques, high-temperature-resistant connecting techniques (i.e. diffusion soldering, low-temperature pressure sintering, adhesive bonding, copper wire bonding) may of course be used consistently throughout the module at locations of the module that correspond to one another. This means, however, that the metallizations of the semiconductor chips that are not exposed to high temperatures or to great alternating temperature loading must have metallizations with copper and/or with a precious metal purely and simply to use the modern connecting technique. This means that the greater reliability of power semiconductor modules that are produced with these modern connecting techniques is bought at the price of increased production costs.

SUMMARY

According to the embodiments described herein, a power semiconductor module is provided in which power semiconductor chips with an aluminum-based chip metallization and power semiconductor chips with a copper-based chip metallization are used together and produced at low cost. According to the embodiments described herein, a corresponding method is provided for operating such a power semiconductor module.

The lifetime of rapidly switching power semiconductor chips, which are used at high temperature and under high alternating temperature loading in switching operation, depends to a great extent on the quality of the connecting technique(s) used, with which the power semiconductor chips are fitted, for which reason a copper-based chip metallization is of advantage in the case of these rapidly switching power semiconductor chips.

In the case of infrequently switching power semiconductor chips, which—in comparison with rapidly switching power semiconductor chips—are used at a lower temperature or under lower alternating temperature loading, for example in rectifier operation, the lifetime is substantially dictated by the chip-internal structure and is not significantly influenced by the connecting technique(s) chosen, for which reason an aluminum-based chip metallization is adequate in the case of these slowly switching power semiconductor chips.

A power semiconductor module for use in a converter is described herein, which comprises a rectifier circuit and an inverter circuit, has a housing, at least one ceramic substrate, as well as a first power semiconductor chip and a second power semiconductor chip. The first power semiconductor chip is a component part of the rectifier circuit and has a first semiconductor body with an upper chip metallization and a lower chip metallization. The second power semiconductor chip is a component part of the inverter circuit and comprises a second semiconductor body with an upper chip metallization and a lower chip metallization. The first power semiconductor chip and the second power semiconductor chip are arranged in the housing.

The upper chip metallization and/or the lower chip metallization of the first power semiconductor chip is respectively adjoined directly by one of the following connecting means: a fusion soldering layer or an aluminum-based bonding wire with an aluminum fraction of at least 99% by weight or at least 99.9% by weight aluminum. The upper chip metallization and/or the lower chip metallization of the second power semiconductor chip is respectively adjoined directly by one of the following connecting means: a diffusion soldering layer; a silver-containing sintering layer; an adhesive bonding layer or a copper-based bonding wire with a copper fraction of at least 99% by weight or at least 99.9% by weight copper.

In the case of the method for operating a power semiconductor module, the first power semiconductor chip is operated at a maximum barrier-layer temperature of less than 150° C. and the second power semiconductor chip is operated at a maximum barrier-layer temperature of more than 150° C.

In the case of fusion soldering, an existing soft solder, for example a tin-based solder, is introduced between two elements to be joined that are to be connected to one another, is melted and is cooled, so as to produce a single fusion soldering layer, which connects the elements to be joined to one another. Unlike in the case of a diffusion soldering layer, however, a fusion soldering layer has a small fraction, i.e. less than about 20% by weight, of intermetallic phases. For the purposes of the embodiments described herein, an item, for example a bonding wire, a metallization or a metal plate, is referred to as "aluminum-based" if it has a fraction of at least 99% or at least 99.9% by weight aluminum.

Also, diffusion soldering, low-temperature pressure sintering or adhesive bonding, or bonding with a copper-based bonding wire, are considered to be connecting techniques for producing high-temperature-resistant connections. For the purposes of the embodiments described herein, an item, for example a bonding wire, a metallization or a metal plate, is referred to as "copper-based" if it has a fraction of at least 99% or at least 99.9% by weight copper. In the case of adhesive bonding, an electrically insulating or electrically conducting adhesive may be used.

With diffusion soldering, during the soldering, materials diffuse out of the elements to be joined that are to be connected to one another into the liquid solder and, together with constituents of the solder, form intermetallic phases, which have a melting point that is higher than the melting point of the solder used. A soldering layer with a fraction of at least 70% by weight intermetallic phases is considered to be a diffusion soldering layer for the purposes of the present invention. Such intermetallic phases may, for example, contain intermetallic copper-tin phases (e.g. Cu3Sn or Cu3Sn5). To produce them, two elements to be joined that are to be connected to one another must be provided with copper on their surfaces to be connected to one another, i.e. on each of the elements to be joined the uppermost layer (before the soldering process) must comprise copper or consist of copper in the region of the intended joining location. A solder containing tin may be used as solder. Optionally, the solder may also be mixed with particles of one or more intermetallic phases before the soldering process. To obtain a stable diffusion soldering layer, it is advantageous if—unlike in the case of conventional fusion soldering connections—intermetallic phases extend, at least in certain portions, continuously between the surfaces of the elements to be soldered that are to be connected to one another.

In the case of low-temperature pressure sintering, a pressure sintering layer is produced by introducing a paste with silver powder and a solvent between the elements to be joined that are to be connected to one another and pressing the elements to be joined against one another under pressure, for example 30 MPa at temperatures in the range from approximately 150° C. to 250° C. To form a silver-containing sintering connecting layer produced in this way, it is advantageous if the elements to be joined contain completely, or at least predominantly, of a precious metal, for example silver or gold, on their surfaces to be joined to one another. Such a silver-containing sintering connecting layer has a silver fraction of at least 99% by weight or at least 99.9% by weight. The silver-containing sintering connecting layer may in this case have a high porosity with an overall pore volume fraction of, for example, approximately 50% by volume of the sintering connecting layer.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 6 shows a plan view of a base plate for a power semiconductor module, which base plate is formed in one piece and has two segments connected by webs;

FIG. 7 shows a plan view of a base plate for a power semiconductor module which has two segments spaced apart from one another;

Unless otherwise indicated, the figures shown are not to scale. The directional terminology used in the following description of the figures (for example terms such as "upper", "lower", "left", "right", "front", "rear", "lateral", "on", "under" etc.) relates to the respective figure. It is merely used for the purpose of making it easier to understand the figures. In principle, the elements shown may be spatially arranged in any way desired, unless the description dictates otherwise. Unless expressly indicated otherwise, the same designations refer to elements that are the same or correspond to one another, with functions that are the same or correspond to one another.

DETAILED DESCRIPTION

Figure 1:
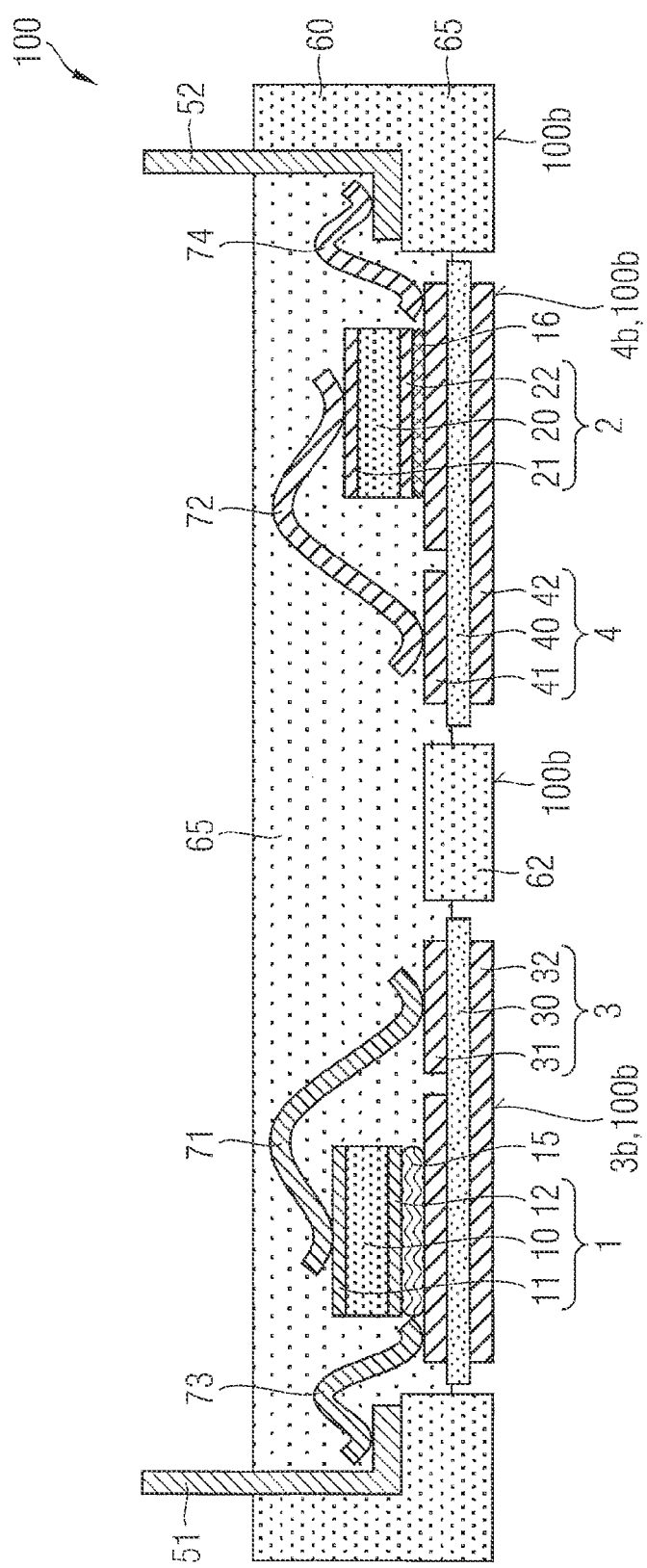
FIG. 1 shows a vertical section through a base-plate-less power semiconductor module with two power semiconductor chips, which are arranged on different ceramic substrates, and one of which has an aluminum-based chip metallization and the other has a copper-based chip metallization.

FIG. 1 shows a vertical section through a power semiconductor module 100. The module has a housing 60 with a housing frame 65, as well as an optional web 62, which is arranged between two metallized ceramic substrates 3 and 4. The ceramic substrates 3, 4 respectively have a ceramic plate-let 30 or 40, which is provided on its upper side with an upper metallization 31 or 41. The upper metallizations 31 and 41 may optionally be patterned. Furthermore, the ceramic substrates 3, 4 respectively have on their undersides an optional, unpatterned lower metallization 32 or 42. The ceramic substrates 3, 4 may in principle be formed—independently of one another and in any desired combinations with one another—as a DCB substrate (DCB=direct copper bonding), as a DAB substrate (DAB=direct aluminum bonding) or as an AMB substrate (AMB=active metal brazing). The upper metallizations 31 and 41 may—likewise independently of one another and in any desired combinations with one another—contain completely, or at least predominantly, copper or aluminum. To avoid temperature-induced curvatures of the substrates 3, 4, the lower metallizations 32 and 42 and the upper metallizations 31 and 41 of a ceramic substrate 3 or 4 may contain the same material throughout the substrate. If need be, the upper metallizations 31, 41 of the ceramic substrates 3 and 4 may be patterned to form conductor tracks and/or conductor areas, in order to permit connection of the electronic components fitted in the power semiconductor module, for example power semiconductor chips.

The ceramic substrates 3 and 4 are fastened in the region of their lateral edges to the housing 60, which however is not represented in FIG. 1. The housing web 62 arranged between two neighboring substrates 3, 4 likewise serves for fastening the ceramic substrates 3 and 4 neighboring it. If the power semiconductor module 100 has just one ceramic substrate, the housing web 62 may be omitted.

Depending on the respective switching requirements of the power semiconductor module, one or more power semiconductor chips 1 or 2 may be arranged on each of the ceramic substrates 3, 4 of the power semiconductor module 100. The designation "1" refers to power semiconductor chips of a rectifier circuit, the designation "2" refers to power semiconductor chips of an inverter circuit.

In principle, a power semiconductor module 100 may have one or more ceramic substrate 3, 4 loaded with in each case at least one power semiconductor chip 1, 2.

Arranged on the upper metallization 31 of the ceramic substrate 3 is a power semiconductor chip 1, on the upper side of which an upper chip metallization 11 has been applied and on the underside of which a lower chip metallization 12 has been applied. The upper chip metallization 11 and the lower chip metallization 12 respectively have at least one aluminum-based sub-layer, the thickness of which may, for example, be more than 1 µm or more than 2 µm.

Between such an aluminum-based sub-layer and the semiconductor body of the power semiconductor chip 1a barrier layer may optionally also be provided, for example a metallic barrier layer, which to the greatest extent prevents diffusion of aluminum from this sub-layer into the semiconductor body. On its side facing away from the power semiconductor body, an aluminum-based sub-layer may also be provided with an optional further metal layer, for example in order to improve the solderability or to protect the otherwise exposed surface of the aluminum-based sub-layer from external mechanical and/or chemical influences. Such a further metal layer may, for example, contain one of the following materials: Ag, NiPd, NiAu or NiPdAu. Optionally, these materials may contain alloying additions.

The semiconductor chip 1 is connected to the upper metallization 31 of the ceramic substrate 3 by means of a connecting layer 15, i.e. by means of a fusion soldering layer. In the case of a connecting layer 15 formed as a fusion soldering layer, the surfaces of the lower chip metallization 12 and the upper substrate metallization 31 that are facing one another may be provided before the soldering process, at least at the locations to be wetted with solder, with a coating which improves the solderability, i.e. reduces the heat requirement during soldering and/or increases the wettability of the surface. Such a coating may, for example, contain nickel, gold or silver or of an alloy with at least one of these metals.

Provided for the upper-side contacting of the power semiconductor chip 1 is an aluminum-based bonding wire 71, which is bonded onto the upper chip metallization 11 of the power semiconductor chip 1. The bonding wire 71 may connect the upper chip metallization 11 to any other component of the power semiconductor module 100. The connection represented in FIG. 1 to the conductor track formed in the upper substrate metallization 31 of the ceramic substrate 3 should therefore be understood as given merely by way of example.

The power semiconductor chip 2 arranged on the ceramic substrate 4 is a rapidly switching power semiconductor chip, which comprises a silicon- or silicon-carbide-based semiconductor body 20, which is provided on its upper side with an upper chip metallization 21 and on its underside with a lower chip metallization 22. The upper chip metallization 21 and the lower chip metallization 22 respectively have at least one copper-based sub-layer, the thickness of which may, for example, be more than 1 μm or more than 2 μm.

Between such a copper-based sub-layer and the semiconductor body of the power semiconductor chip 1 a barrier layer may optionally also be provided, for example a metallic barrier layer, which to the greatest extent prevents diffusion of copper from this sub-layer into the semiconductor body. On its side facing away from the power semiconductor body, a copper-based sub-layer may also be provided with an optional further metal layer, for example in order to protect the otherwise exposed surface of the copper-based sub-layer from external mechanical and/or chemical influences. Such a further metal layer may, for example, contain one of the following alloys: Ag, NiPd, NiAu or NiPdAu. Optionally, these alloys may contain further alloying additions.

To connect the power semiconductor chip 2 firmly to the ceramic substrate 4, a connecting layer 16 is provided which connects the lower chip metallization 22 to the upper metallization 41 of the ceramic substrate 4. The connecting layer 16 may be formed as a diffusion soldering layer, as an adhesive bonding layer or as a silver-containing sintering layer.

In the case of a connecting layer 16 formed as a diffusion soldering layer, the surfaces of the lower chip metallization 22 and the upper substrate metallization 41 that are to be connected to one another consist completely, or at least predominantly, of copper. To produce the diffusion soldering connection, a tin-based solder is used. The finished diffusion soldering layer contains at least 70% by weight of one or more intermetallic copper-tin phases, for example Cu3Sn or Cu3Sn5.

In the case of a connecting layer 16 formed as a silver-containing sintering layer, the lower metallization 22 of the power semiconductor chip 2 and the upper metallization 41 of the ceramic substrate 4 are provided before sintering, at least in the region of their surfaces to be connected to one another, with a coating of precious metal, for example silver or gold or an alloy with at least one of these metals.

To electrically connect the power semiconductor chip 2 also on its upper side, a copper-based bonding wire 72 is provided, which wire is bonded to the upper chip metallization 21. The upper chip metallization 21 may be connected by the bonding wire 72 to any other electrical component of the power semiconductor module 100. The connection shown in FIG. 1 to a portion of the upper substrate metallization 41 that is formed as a conductor track should therefore be understood as given merely by way of example.

The power semiconductor chips 1, 2 of the power semiconductor module 100 may, for example, be a component part of a converter circuit, which is completely or partially implemented in the power semiconductor module 100. The converter circuit contains, inter alia, a rectifier circuit and an inverter circuit. The power semiconductor chip 2 is a component part of the inverter circuit and is used in a rapidly switched mode in alternating switching operation. It is therefore exposed to high temperatures and great alternating temperature loading. The power semiconductor chip 1 is a component part of the rectifier circuit. In comparison with the power semiconductor chip 2, it is exposed to lower maximum temperatures and undergoes lower alternating temperature loading.

In the case of the example according to FIG. 1, one or more semiconductor chips 1 are arranged on the ceramic substrate 3, but no high-temperature-resistant power semiconductor chips 2. As a result, the circuitry part of the power semiconductor module that is arranged on the ceramic substrate 3 is operated at lower temperatures than the circuitry part that is arranged on the ceramic substrate 4, so that conventional connecting techniques, i.e. connecting layers 15 comprising a fusion solder or bonding connections with aluminum-based bonding wires 71, may be used to connect the semiconductor chip or chips 1 to the ceramic substrate 3 and/or electrically connect the power semiconductor chip or chips 1.

In principle, modern, high-temperature-resistant power semiconductor chips with copper-based chip metallizations may also be fitted on the ceramic substrate 3, provided that these power semiconductor chips are not operated in a temperature range that leads to an inadmissible increase in the temperature in the connecting layer or layers 15 by which the other power semiconductor chips 1 of the module 100 that are arranged on the ceramic substrate 3 are connected to the ceramic substrate 3.

One or more high-temperature-resistant power semiconductor chips 2 with copper-based chip metallizations 21, 22 are arranged on the ceramic substrate 4, but no power semiconductor chips with aluminum-based chip metallizations. Each of the power semiconductor chips 2 mounted on the ceramic substrate 4 is connected to the upper metallization 41 by means of a high-temperature-resistant connecting technology, i.e. by means of a high-temperature-resistant connecting layer 16 formed as a silver-containing sintering layer or as a diffusion soldering layer, and/or is electrically connected to further components of the power semiconductor module 100 by means of a copper-based bonding wire 72.

To connect the power semiconductor module 100 to the outside, metallic terminal lugs 51, 52 are provided, for example punched and bent copper sheets, which protrude from the housing 60 and the outer ends of which can be screwed, pressed, clamped or soldered to other electrical components. Furthermore, the housing 60 is filled with a soft molding compound 65, for example a silicone gel, which increases the insulation resistance of the power semiconductor module 100, and covers at least the upper sides of all the power semiconductor chips 1, 2 of the power semiconductor module 100.

To connect the terminal lugs 51, 52 in an electrically conducting manner to the circuit integrated in the power semiconductor module 100, an aluminum-based bonding wire or an aluminum-based strip 73 is provided, which wire or strip connects the terminal lug 51 to the upper substrate metallization 31 of the ceramic substrate 3, as well as a copper-based bonding wire or a copper-based strip 74, which wire or strip connects the upper metallization 41 of the ceramic substrate 4 to the terminal lug 52.

Instead of connecting the terminal lugs 51 and/or 52 to the respective upper substrate metallizations 31 and 41 by means of bonding wires 73 and 74, the lower ends of the terminal lugs 51 and/or 52 may also be connected to the respective substrate metallizations 31 and 41 directly by means of ultrasonic welding.

The aluminum-based bonding wires or strips 73 may also be used at this location, since they undergo much lower temperatures and alternating temperature loading than a bonding wire 72 bonded onto a power semiconductor chip 2. In principle, the bonding wires or strips 73 may, however, also be formed as copper-based bonding wires or strips 73.

The power semiconductor module 100 shown in FIG. 1 is a so-called "base-plate-less" power semiconductor module, since it does not have a base plate on which the ceramic substrates 3, 4 of the power semiconductor module 100 are together mounted. Therefore, the undersides 3b, 4b of all the ceramic substrates 3, 4 that are fitted in the power semiconductor module 100 and loaded with a power semiconductor chip 1 or 2 form part of the underside 100b of the power semiconductor module 100.

Figure 2:
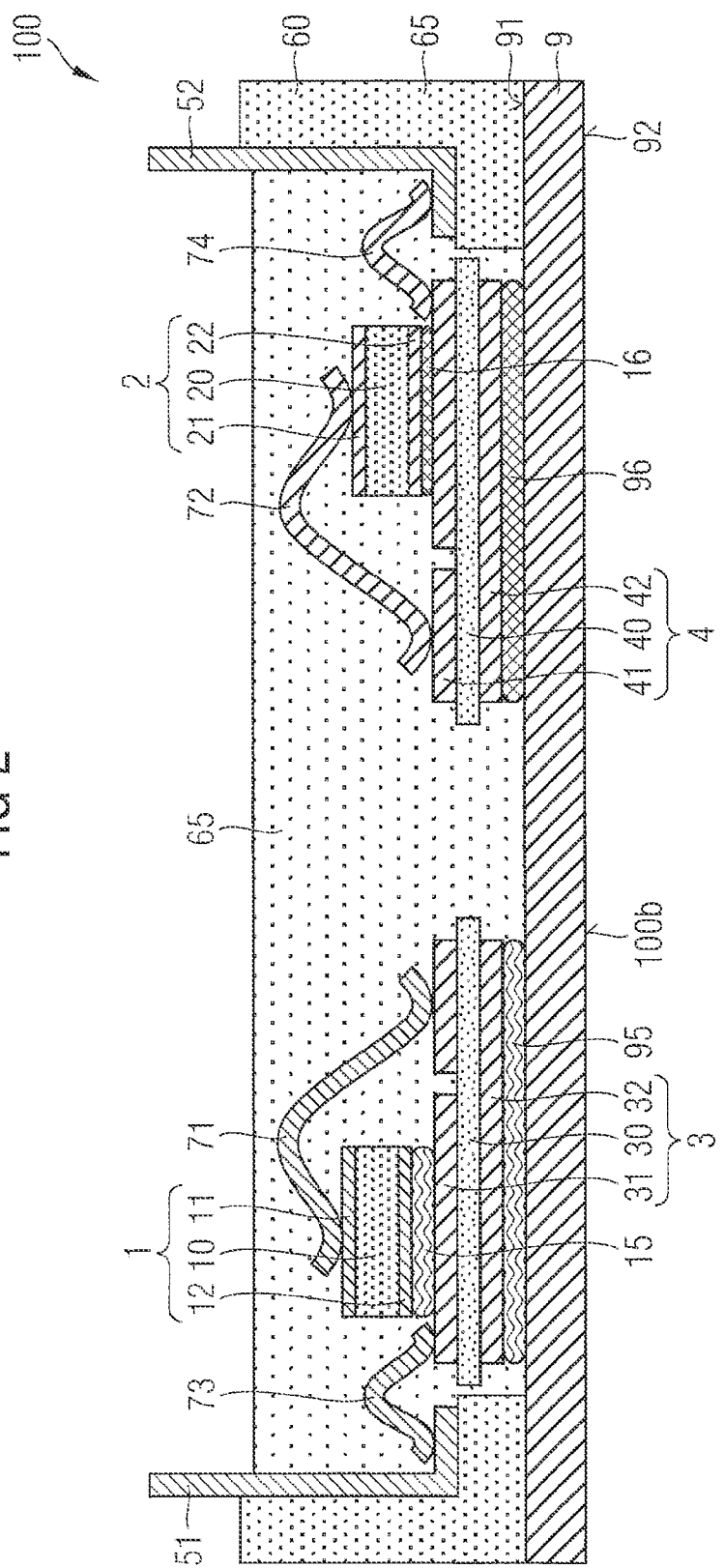
FIG. 2 shows a vertical section through a power semiconductor module with two power semiconductor chips, which are arranged on different ceramic substrates mounted on a base plate of the power semiconductor module, and one of which has an aluminum-based chip metallization and the other has a copper-based metallization.

In comparison with this, FIG. 2 shows a power semiconductor module 100 with a base plate 9, which may, for example, be copper-based. It has an upper side 91, as well as an underside 92. Arranged on the base plate 9 are respectively loaded ceramic substrates 3, 4, the lower metallizations 32 and 42 of which are connected to the upper side 91 of the base plate 9 by means of connecting layers 95 and 96. In the case of a connecting layer 95 or 96 formed as a soldering layer, an anchoring structure may be provided. Such an anchoring structure may, for example, be formed as a metal grid or as a metal mesh, which is placed between the lower metallization 32 or 42 of the ceramic substrate 3 or 4 for soldering and is included in the soldering. Another example of an anchoring structure is a multiplicity of elongated pillars, which run on the underside of the lower substrate metallization 32 or 42, substantially perpendicularly in relation to the ceramic platelet 30 or 40 concerned, and are a component part of the lower substrate metallization 32 or 42.

To avoid bending of the base plate 9, loaded with at least one ceramic substrate 3, 4, during the operation of the power semiconductor module 100 as a result of excessive temperature, the base plate 9 may be pre-bent before it is loaded with the ceramic substrates 3, 4, so that the underside 92 of the base plate 9 is as planar as possible, in particular at high operating temperatures, in order to achieve dissipation that is as good as possible of the lost heat occurring in the power semiconductor chips 1, 2 to a heatsink (not shown) mounted on the underside 92 of the base plate 9.

The ceramic substrates 3, 4 and their loading with power semiconductor chips 1, 2 and bonding wires 71, 72, as well as the connection with bonding wires 73 and 74 may take place in the same manner, with the same materials and with the same connecting techniques as described above in the case of the power semiconductor module 100 according to FIG. 1.

Since all the power semiconductor chips 1 arranged on the ceramic substrate 3 are operated at comparatively low temperatures, i.e. at a barrier-layer temperature of less than, for example, 125° C. or 150° C., a conventional connecting technique, i.e. fusion soldering, can be used for connecting the ceramic substrate 3 to the base plate 91. The connecting layer 95 is accordingly formed as a fusion soldering layer. As an alternative to this, the connecting layer 95 may also be formed as a diffusion soldering layer, as an adhesive bonding layer or as a silver-containing sintering layer.

The power semiconductor chips 2 arranged on the ceramic substrate 4 are operated at comparatively high temperatures, i.e. at a barrier-layer temperature of more than 125° C., more than 150° C. or more than 175° C., for which reason the connecting layer 96, which connects the lower metallization of the ceramic substrate 4 to the base plate 9, must be resistant to high temperature and stable under changing temperatures, i.e. the connecting layer 96 is formed as a diffusion soldering layer, as an adhesive bonding layer or as a silver-containing sintering layer. In the case of this power semiconductor module 100, the underside 92 of the base plate 9 forms at least the greatest part of the underside 100b of the power semiconductor module 100. All the ceramic substrates 3, 4 of the power semiconductor module 100 that are loaded with a power semiconductor chip 1, 2 can be connected to the upper side 91 of the base plate 9 by means of the same one of the following connecting techniques: diffusion soldering, silver pressure sintering or adhesive bonding.

Figure 3:
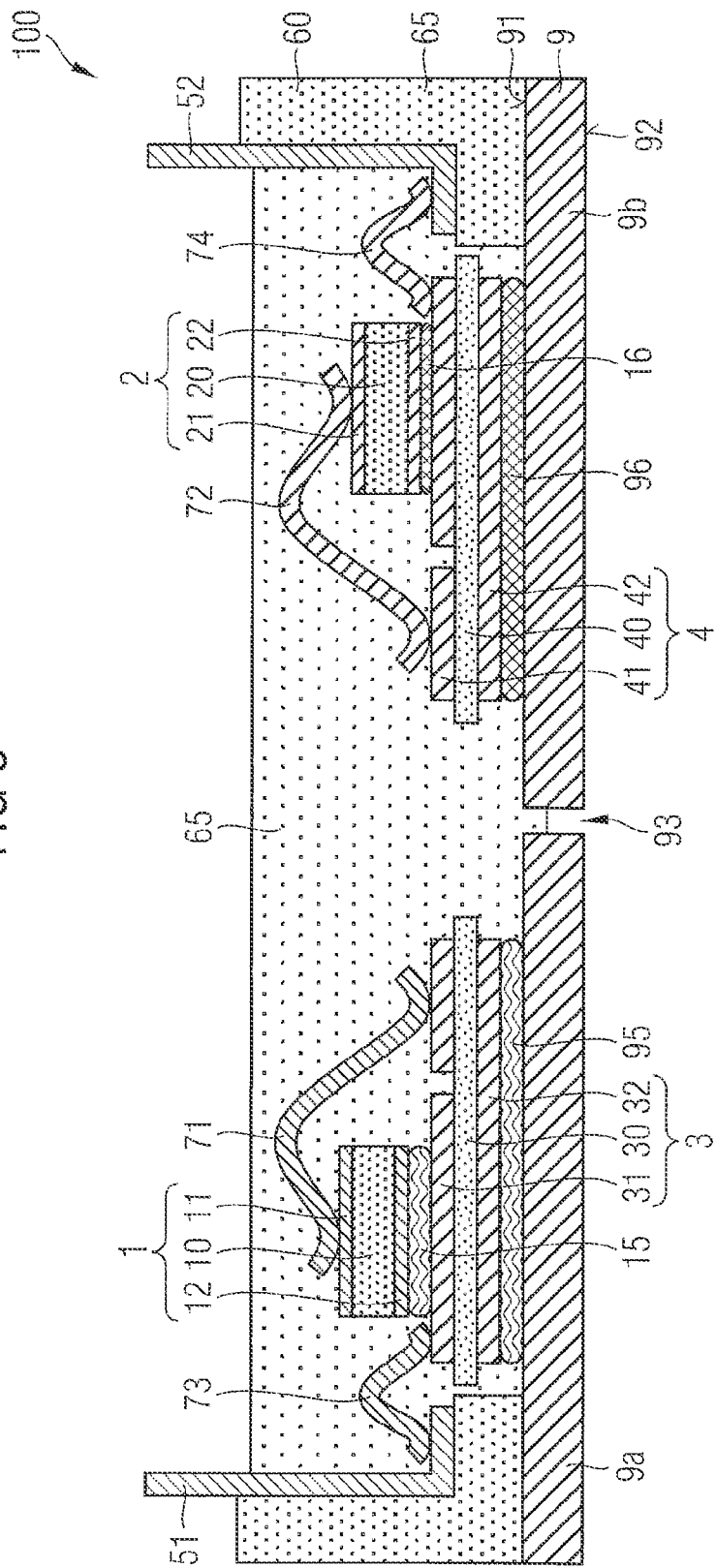
FIG. 3 shows a vertical section through a power semiconductor module with a rectifier circuit and an inverter circuit, the power semiconductor chips of the rectifier circuit being spatially grouped in a first group and the power semiconductor chip of the inverter circuit being spatially grouped in a second group, and the individual groups being arranged on thermally isolated segments of a base plate.

The power semiconductor module shown in FIG. 3 differs from the power semiconductor module according to FIG. 2 in that the base plate 9 has at least two segments 9a, 9b that are thermally largely isolated from one another. The thermal isolation is achieved by a gap 93 between the segments 9a and 9b. The gap 93 may be formed continuously, so that the segments 9a and 9b are spaced apart from one another. As an alternative to this, the segments 9a and 9b may also be connected to one another by webs.

Figure 4A:
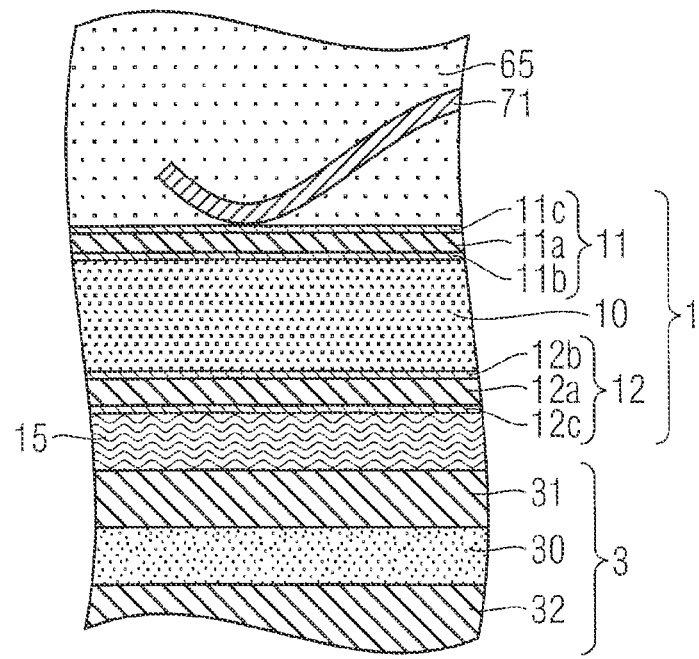
FIG. 4A shows an enlarged representation of a power semiconductor chip, as can be used in the case of the power semiconductor modules according to FIGS. 1 to 3, in which the upper and lower metallizations respectively have a number of sub-layers.

FIG. 4A shows an enlarged representation of a power semiconductor chip 1, as can be used for example in the case of the power semiconductor modules according to FIGS. 1 to 3, for example in a rectifier circuit.

The upper metallization 11 of the first power semiconductor chip 1 has a number of metallic sub-layers 11a, 11b and 11c; the lower metallization 12 has a number of metallic sub-layers 12a, 12b and 12c.

The first sub-layer 11a of the upper metallization 11 and the first sub-layer 12a of the lower metallization 12 are respectively aluminum-based and contain more than 99% by weight, or even to more than 99.9% by weight, of aluminum. Their function is primarily that of carrying high currents of the first power semiconductor chip 1. They therefore have relatively great thicknesses in comparison with the other sub-layers 11b and 11c or 12b and 12c, for example more than 1 µm or more than 2 µm, for example approximately 3 µm.

The second sub-layer 11b of the upper metallization 11 and the second sub-layer 12b of the lower metallization 12 undertake the function of barrier layers, with the aim of significantly reducing the diffusion of aluminum from the first sub-layer 11a of the upper metallization 11 and from the first sub-layer 12a of the lower metallization 12 into the semiconductor body 10. The second sub-layers 11b and/or 12b may, for example, contain one or more of the following materials: TiN; Ta; TaN; TiW; W; alloys or combinations of these layers. The thicknesses of the second sub-layers 11b and/or 12b may be, for example, in each case approximately 500 nm.

The third sub-layer 11c of the upper metallization 11 is arranged on the side of the first sub-layer 11a of the upper metallization 11 that is facing away from the semiconductor body 10. Correspondingly, the third sub-layer 12c of the lower metallization 12 is arranged on the side of the first sub-layer 12a of the lower metallization 12 that is facing away from the semiconductor body 10. The third sub-layers 11c and 12c may, for example, contain one or more of the following materials: Ag, NiPd, NiAu or NiPdAu. Optionally, these materials may contain alloying additions.

Furthermore, the upper metallization 11 may also have additional, optional sub-layers, which are arranged between the first sub-layer 11a of the upper metallization 11 and the second sub-layer 11b of the upper metallization 11 and/or between the second sub-layer 11b of the upper metallization 11 and the semiconductor body 10. Correspondingly, the lower metallization 12 may optionally also have further sub-layers, which are arranged between the first sub-layer 12a of the lower metallization 12 and the second sub-layer 12b of the lower metallization 12 and/or between the second sub-layer 12b of the lower metallization 12 and the semiconductor body 10.

Figure 4B:
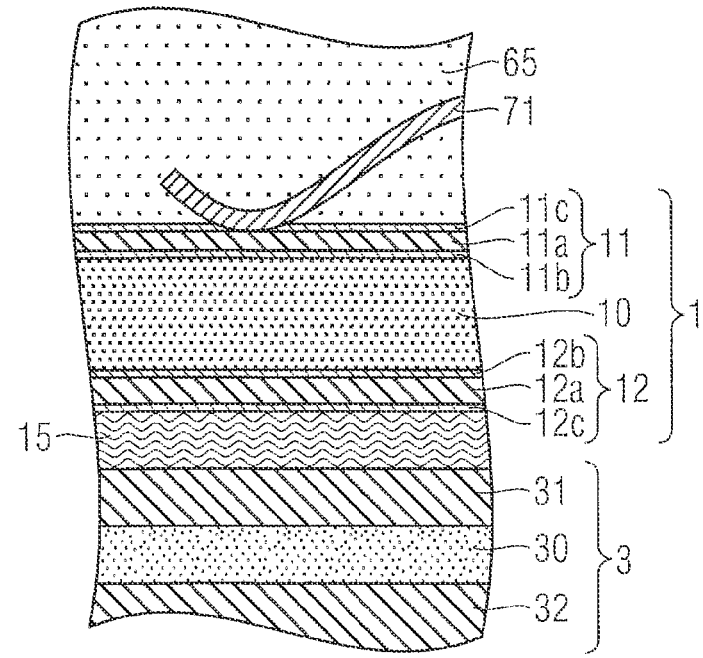
FIG. 4B shows an enlarged representation of a power semiconductor chip, as can be used in the case of the power semiconductor modules according to FIGS. 1 to 3, in which the upper metallization has an aluminum-based sub-layer, which directly contacts an aluminum-based bonding wire.

While here the third sub-layer 11c of the upper metallization 11 is arranged between the bonding wire 71 and the first sub-layer 11a, the third sub-layer 11c of the upper metallization 11 according to an alternative refinement shown in FIG. 4B is locally destroyed during the production of the bonding connection by the bonding wire 71, so that the bonding wire 71 directly contacts the first sub-layer 11a of the upper metallization 11 and forms a firm bonding connection with it.

Figure 5A:
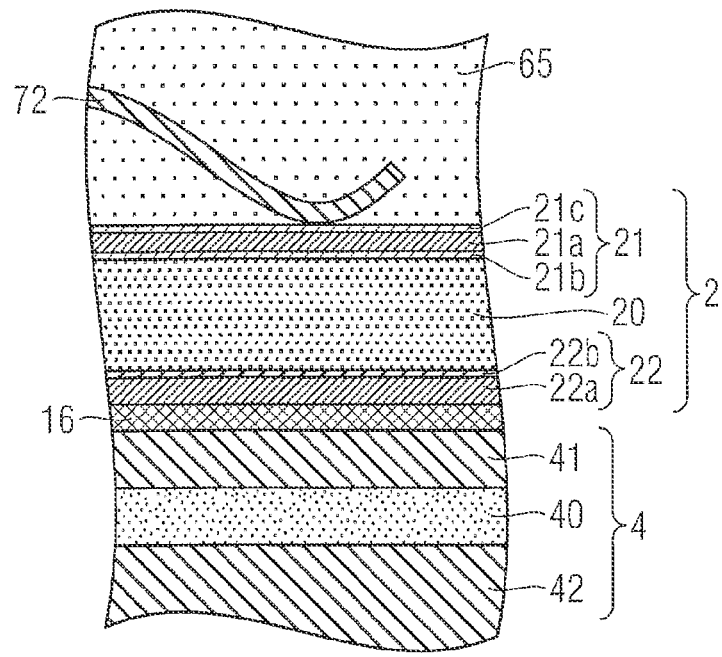
FIG. 5A shows an enlarged representation of a power semiconductor chip, as can be used in the case of the power semiconductor modules according to FIGS. 1 to 3, in which the upper and lower metallizations respectively have a number of sub-layers.

FIG. 5 shows an enlarged representation of a power semiconductor chip 2, as can be used for example in the case of the power semiconductor modules according to FIGS. 1 to 3, for example in an inverter circuit.

The upper metallization 21 of the second power semiconductor chip 2 has a number of metallic sub-layers 21a, 21b and 21c; the lower metallization 22 has a number of metallic sub-layers 22a and 22b.

The first sub-layer 21a of the upper metallization 21 and the first sub-layer 22a of the lower metallization 22 are respectively copper-based and contain more than 99% by weight, or even more than 99.9% by weight, of copper. Their function is primarily that of carrying high currents of the second power semiconductor chip 2. They therefore have relatively great thicknesses in comparison with the other sub-layers 21b and 21c or 22b and 22c, for example more than 1 μm or more than 2 μm, for example approximately 3 μm.

The second sub-layer 21b of the upper metallization 21 and the second sub-layer 22b of the lower metallization 22 undertake the function of barrier layers, with the aim of significantly reducing the diffusion of copper from the first sub-layer 21a of the upper metallization 21 and from the first sub-layer 22a of the lower metallization 22 into the semiconductor body 20. The second sub-layers 21b and 22b may, for example, contain one or more of the following materials: TiN; Ta; TaN; TiW; W; alloys or combinations of these layers. The thicknesses of the second sub-layers 21b and/or 22b may be, for example, in each case approximately 500 nm.

The third sub-layer 21c of the upper metallization 21 is arranged on the side of the first sub-layer 21a of the upper metallization 21 that is facing away from the semiconductor body 20. It may, for example, contain one or more of the following materials: NiPd, NiAu or NiPdAu. Optionally, these materials may contain alloying additions.

Furthermore, the upper metallization 21 may also have additional, optional sub-layers, which are arranged between the first sub-layer 21a of the upper metallization 21 and the second sub-layer 21b of the upper metallization 21 and/or between the second sub-layer 21b of the upper metallization 21 and the semiconductor body 20. Correspondingly, the lower metallization 22 may optionally also have further sub-layers, which are arranged between the second sub-layer 22b of the lower metallization 22 and the semiconductor body 20.

Optionally, the lower metallization 11 may have before the production of the soldering connection between the second power semiconductor chip 2 and the ceramic substrate 4, as a third sub-layer, a tin-containing soldering layer, which forms the lower surface of the power semiconductor chip 2 before the production of the soldering connection, and has been applied directly or indirectly to the side of the first sub-layer 22a that is facing away from the semiconductor body 20. To produce the soldering connection between the second power semiconductor chip 2 and the ceramic substrate 4, the tin-containing soldering layer may be melted and cooled, so that the connecting layer 16 is produced from it. During the soldering operation, copper can diffuse from the upper metallization 41 of the ceramic substrate 4 and, if the tin-containing solder has been applied directly to the first sub-layer 22a of the lower metallization 22 of the second semiconductor chip 2, from the first sub-layer 22a of the lower metallization 22 into the tin-containing solder and form with the tin contained therein high-melting intermetallic copper-tin phases, for example Cu3Sn or Cu3Sn5.

Figure 5B:
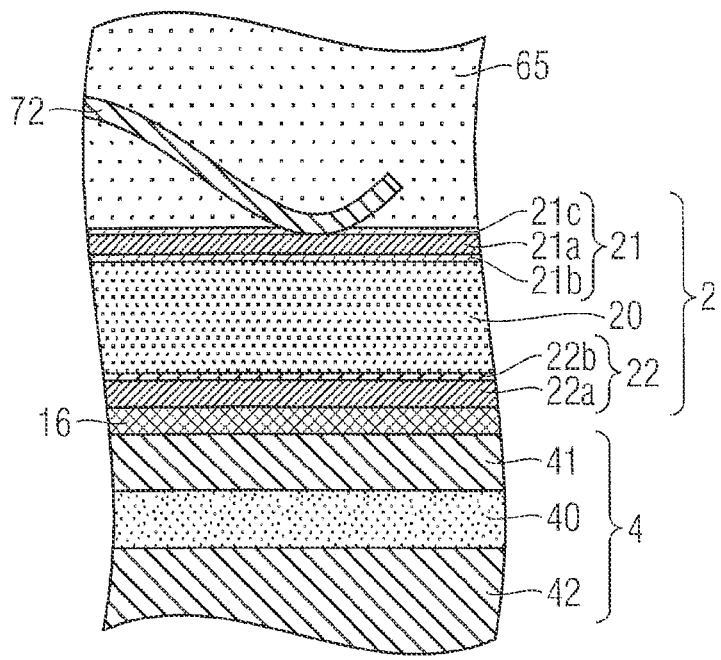
FIG. 5B shows an enlarged representation of a power semiconductor chip, as can be used in the case of the power semiconductor modules according to FIGS. 1 to 3, in which the upper metallization has a copper-based sub-layer, which directly contacts a copper-based bonding wire.

While here the third sub-layer 21c of the upper metallization 21 is arranged between the bonding wire 72 and the first sub-layer 21a, the third sub-layer 21c of the upper metallization 21 according to an alternative refinement shown in FIG. 5B is locally destroyed during the production of the bonding connection by the bonding wire 72, so that the bonding wire 72 directly contacts the first sub-layer 21a of the upper metallization 21 and forms a firm bonding connection with it.

FIG. 6 shows a base plate 9 with two segments 9a and 9b, which are thermally isolated from one another and are connected to one another by means of webs 94. Gaps 93 are formed as elongate slits in the one-piece base plate 9. The portions of the upper side 91 of the base plate 9 on which the ceramic substrates 3 and 4 are mounted are represented by dashed lines.

According to an alternative example of a base plate 9 shown in FIG. 7, the segments 9a, 9b thereof may also be spaced apart from one another.

Figure 8:
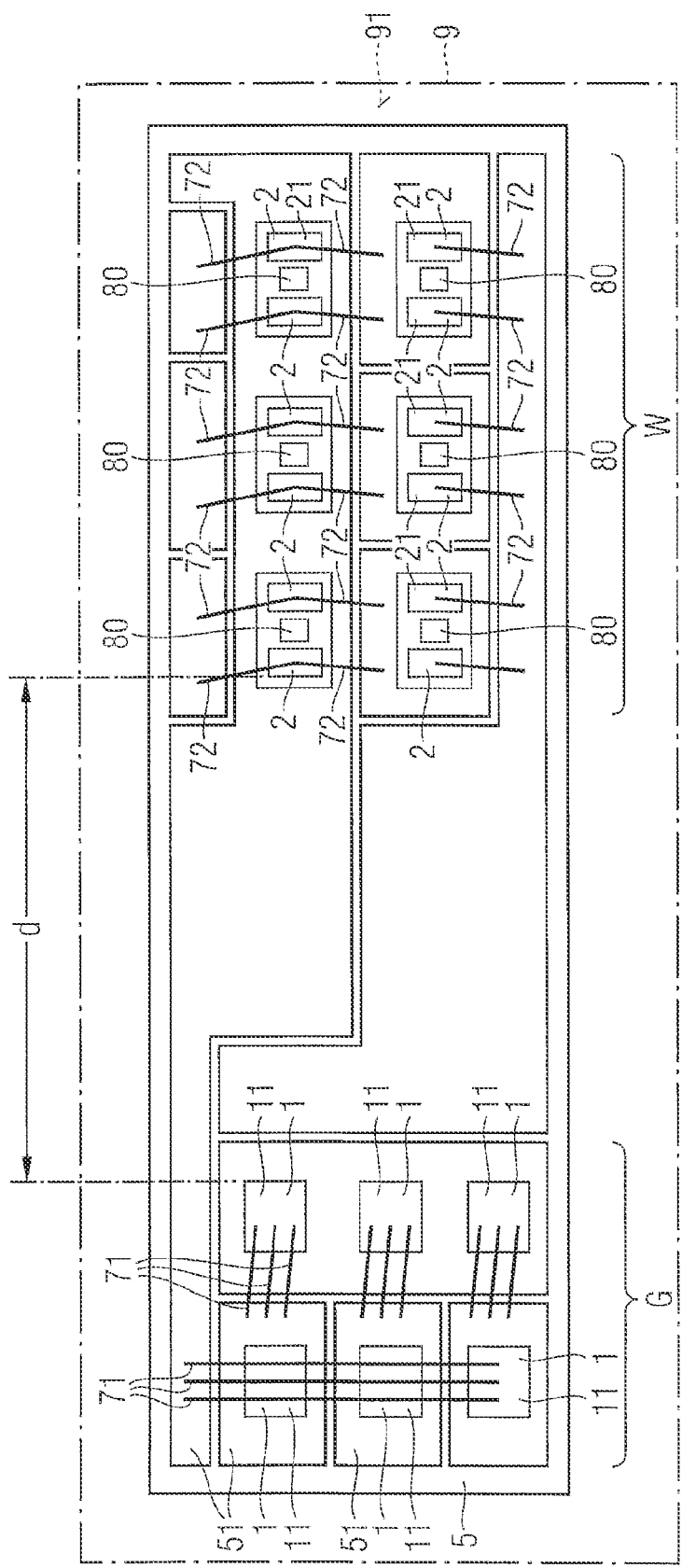
FIG. 8 shows a plan view of a ceramic substrate in which all the power semiconductor chips of a rectifier circuit are respectively spatially grouped in a first group and all the power semiconductor chips of an inverter circuit are respectively spatially grouped in a second group.

FIG. 8 shows a plan view of a ceramic substrate 5, on which power semiconductor chips 1 with aluminum-based chip metallizations 11 as well as power semiconductor chips 2 with copper-based chip metallizations 21 are arranged. All the power semiconductor chips 1 with aluminum-based chip metallizations are connected to the upper metallization 51 of the ceramic substrate 5 by means of a connecting layer which may be formed and produced like the connecting layer 15 explained in FIG. 1. In this case, various power semiconductor chips 1 may also be connected to the metallization 51 by different conventional connecting techniques. Similarly, all the power semiconductor chips 1 arranged on the ceramic substrate 5 may be connected to the upper metallization 51 by the same conventional connecting technique.

Correspondingly, the power semiconductor chips 2 with copper-based chip metallizations 21 are rapidly switching and operated at high temperatures, and respectively connected to the upper metallization 51 by a high-temperature-resistant connecting layer, which may be constructed like the connecting layer 16 explained in FIG. 1. Here, various power semiconductor chips 2 may also be connected to the metallization 51 by different high-temperature-resistant connecting techniques. As an alternative to this, all the power semiconductor chips 2 arranged on the ceramic substrate 5 may be connected to the metallization 51 by the same high-temperature-resistant connecting technique.

Furthermore, the power semiconductor chips 1 with their aluminum-based chip metallizations are connected at their upper, aluminum-based chip metallizations 11 by means of aluminum-based bonding wires 71. As a difference from this, the power semiconductor chips 2 with their copper-based chip metallizations 21, operated at high barrier-layer temperatures, are connected at their copper-based upper chip metallizations 21 by means of copper-based bonding wires 72.

Furthermore, passive devices 80, such as for example temperature sensors, NTC thermistors (NTC=negative temperature coefficient), shunt resistors, capacitors, etc. are arranged near the power semiconductor chips 2 of the inverter circuit W. These passive devices 80 likewise have metallizations at which they are connected to the ceramic substrate by means of a diffusion soldering layer, an adhesive bonding layer or a silver sintering layer. Such passive devices 80 may also be arranged in the case of arrangements according to FIGS. 1 to 3 by the same connecting techniques on the same substrate or substrates 4 on which a power semiconductor chip 2 of the inverter circuit is also located.

In order in the case of the arrangement according to FIG. 8 to isolate the power semiconductor chips 1 with aluminum-based chip metallizations, their connecting layers, with which they are connected to the metallization 51, as well as the bonding wires 71 from the high temperature that occurs during the operation of the power semiconductor chips 2 with copper-based chip metallizations, the power semiconductor chips 1 and the power semiconductor chips 2 are arranged spaced apart from one another on the ceramic substrate 5. The smallest distance d between a power semiconductor chip 1 and a power semiconductor chip 2 may be chosen to be, for example, greater than 5 mm or greater than 10 mm. In this respect it is expedient to combine the power semiconductor chips 1 and the power semiconductor chips 2 in groups that are respectively spatially separate. These groups are then likewise at the distance d from one another.

In the case of the example according to FIG. 8, the power semiconductor chips 1 with the aluminum-based chip metallizations are a component part of a rectifier circuit G, which is exposed to comparatively low alternating temperature loading. By comparison, the power semiconductor chips 2 with the copper-based chip metallizations are a component part of an inverter circuit W. They are exposed to much higher barrier-layer temperatures and alternating temperature loading than the first power semiconductor chips 1.

If the ceramic substrate is used in a base-plate-less power semiconductor module, it forms the underside of the ceramic substrate 5 that is facing away from the upper metallization 51 and may have a lower metallization, part of the underside of the power semiconductor module. As an alternative to this, a ceramic substrate 5 that is constructed and loaded according to the principles explained on the basis of FIG. 8 may also be used in a power semiconductor module with a base plate. For this purpose, the ceramic substrate 5 is connected with its lower metallization, which is concealed in FIG. 8, to the upper side 91 of a base plate 9 represented by dashed lines. The production and the structure of the connecting layer used for this purpose correspond to the production and the structure of the connecting layer 96 explained with regard to FIGS. 2 and 3.

Figure 9:
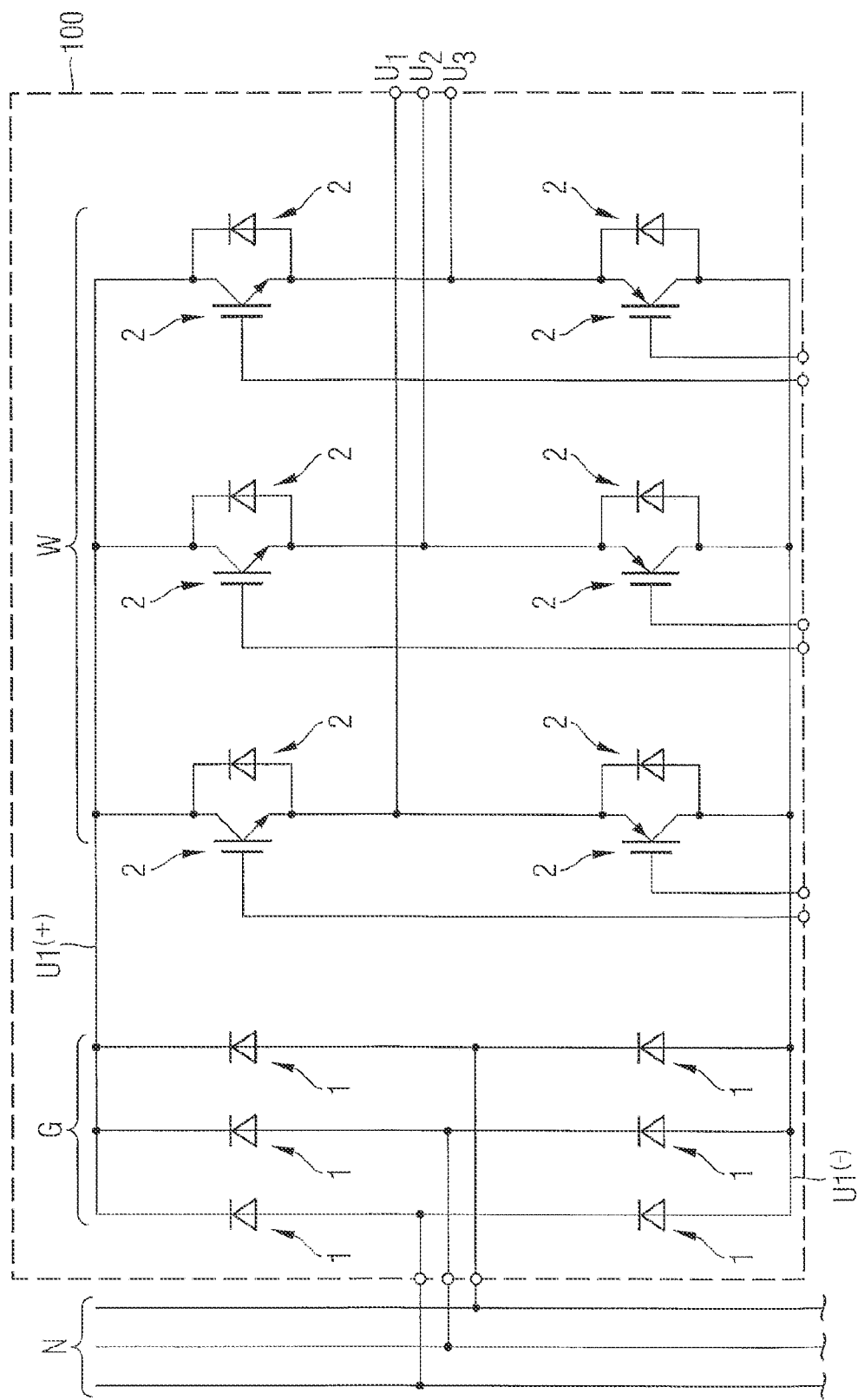
FIG. 9 shows a circuit diagram with a power semiconductor module which contains power semiconductor chips for a rectifier circuit and power semiconductor chips for an inverter circuit.

FIG. 9 shows a circuit diagram with a partial circuit diagram of a power semiconductor module 100, which contains power semiconductor chips 1 for a rectifier circuit G and power semiconductor chips 2 for an inverter circuit W. The overall circuit diagram shows, inter alia, a three-phase network N, given by way of example, with which a low-frequency alternating current, for example a three-phase current with 25 Hz, 50 Hz or 60 Hz, is provided and is rectified by means of the rectifier circuit G to provide a DC link voltage U1 (+)–U1 (−). The rectifier circuit G comprises for each phase of the network N two series-connected rectifier devices 1, which may be formed as shown as diodes or alternatively as thyristors. The rectifier devices 1 of the rectifier circuit G are slowly switching power semiconductor chips with aluminum-based chip metallizations.

A generally required DC link capacitor for smoothing the DC link voltage is not represented. If required, such a capacitor may be arranged outside or inside the housing of the power semiconductor module 100.

The DC link voltage is conditioned to provide a supply of an output voltage switched at high frequency, by way of example a three-phase output voltage U1, U2, U3. The switching frequency, which is higher than the frequency of the network N, may be, for example, more than 500 Hz. The frequency depends on the blocking voltage class of the power semiconductor chips 2 of the inverter circuit. For example, the frequency may be 500 Hz in the case of a permissible blocking voltage of 3.3 kV, or 1 kHz in the case of a permissible blocking voltage of 1.7 kV or 2 kHz in the case of a permissible blocking voltage of 1.2 kV. The output voltage supply serves for operating an electrical load, for example an electric motor.

For conditioning the DC link voltage, a half bridge arm, to which the DC link voltage is respectively applied, is provided for each phase of the output voltage supply U1, U2, U3 to be provided. Each of the half bridge arms comprises two controllable power semiconductor switches, for example the IGBTs shown, or else MOSFETs or JFETs, the load paths of which are connected in series. Connected in anti-parallel to each of the load paths of the controllable power semiconductor switches is a rapidly switching freewheeling diode. The controllable power semiconductor switches and the freewheeling diodes of the inverter circuit W are rapidly switching power semiconductor chips with copper-based chip metallizations.

In a power semiconductor module 100 according to the partial circuit diagram shown in FIG. 9, all the power semiconductor chips 1 with the aluminum-based chip metallizations of the power semiconductor module 100 may be arranged on a first ceramic substrate (see for example the ceramic substrate 3 in FIGS. 1, 2 and 3) and all the power semiconductor chips 2 with the copper-based chip metallizations may be arranged on a second ceramic substrate (see for example the ceramic substrate 4 in FIGS. 1, 2 and 3). In general, any desired sub-amount of the first power semiconductor chips 1 of the power semiconductor module 100 may be arranged on a first ceramic substrate (see for example the ceramic substrate 3 in FIGS. 1, 2 and 3) and any desired sub-amount of the second power semiconductor chips 2 of the power semiconductor module 100 may be arranged on a second ceramic substrate (see for example the ceramic substrate 4 in FIGS. 1, 2 and 3). Furthermore, various power semiconductor chips 1 with aluminum-based chip metallizations may be arranged in a distributed manner on two or more ceramic substrates. The same applies correspondingly to various power semiconductor chips 2 with copper-based chip metallizations, i.e. various power semiconductor chips 2 may be arranged in a distributed manner on two or more ceramic substrates.

The phases of the network N may in principle be of any desired number. The same applies to the number of phases of the output voltage supply U1, U2, U3. Sub-units of the unit comprising the rectifier circuit G and the inverter circuit W may also be distributed on two or more power semiconductor modules each with a housing of their own. Such power semiconductor modules may be constructed according to the principle explained on the basis of FIGS. 1 to 8, which presupposes that at least one power semiconductor chip 1 with aluminum-based chip metallization and at least one power semiconductor chip 2 with copper-based chip metallization are provided within the module housing concerned.

Figure 10:
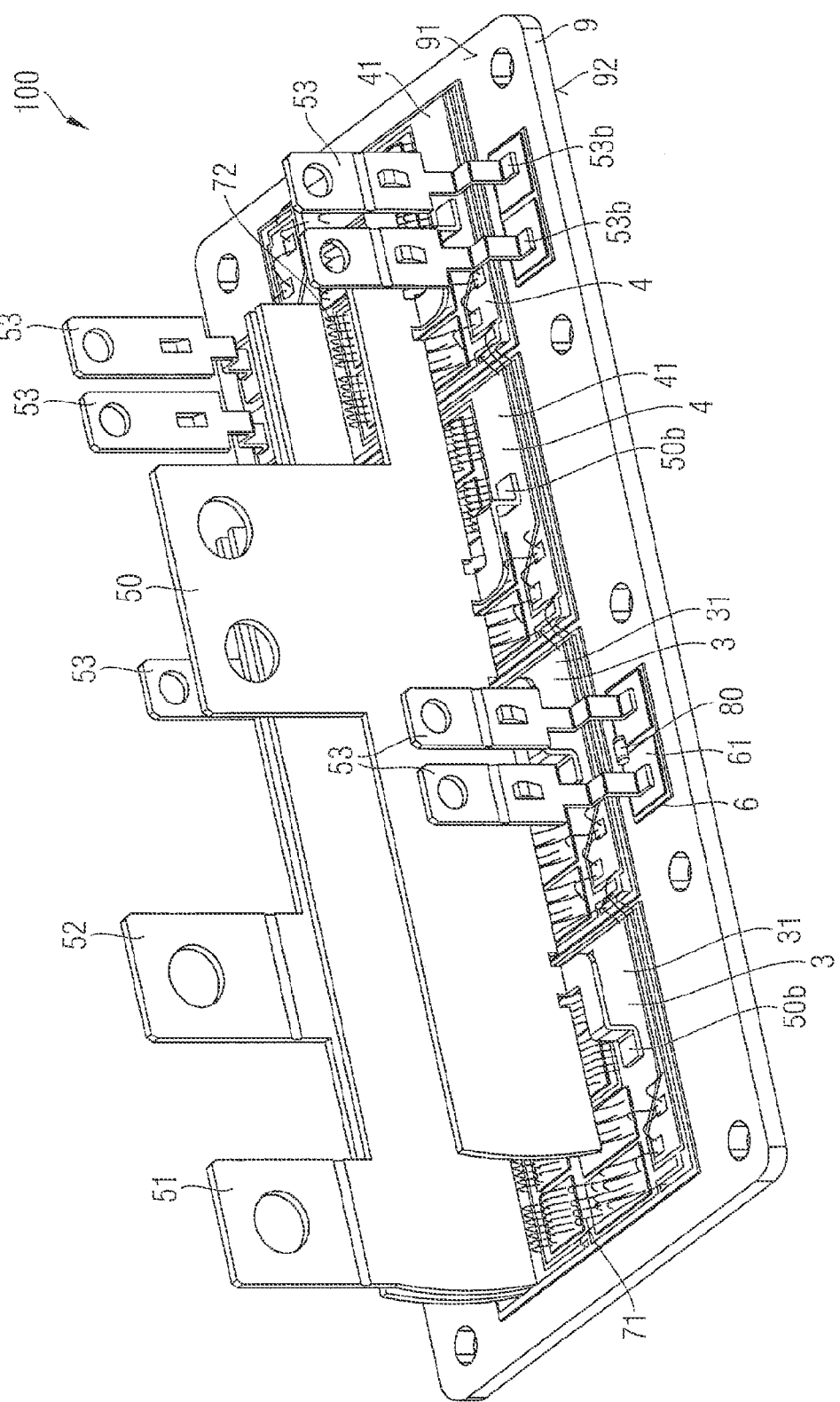
FIG. 10 shows a perspective view of a power semiconductor module with the housing removed.

FIG. 10 shows a perspective view of a power semiconductor module 100. The housing and the molding compound have been removed for ease of illustration. A number of ceramic substrates 3, 4 are arranged on a common base plate 9 and firmly connected to the upper side 91 thereof. The ceramic substrates 3, 4 have on their upper sides patterned metallizations 31 and 41, and on their undersides metallizations that are concealed in FIG. 10. Furthermore, apart from the thick load-current terminal lugs 50, 51, 52, terminal lugs 53 are provided, serving the purpose of feeding control signals to the power semiconductor module 100 or, for example, providing status signals or any other desired signals of the power semiconductor module 100. The terminal lugs 50, 51, 52, 53 in any case serve the purpose of electrically contacting the power semiconductor module 100 outside the housing.

At least some of the terminal lugs 50, 51, 52, 53 may have angled-away foot regions 50b, 51b (concealed), 52b (concealed) and 53b, by which the terminal lug 50, 51, 52, 53 concerned is firmly connected to an upper metallization of a ceramic substrate. Suitable, for example, as connecting techniques for this are fusion soldering, diffusion soldering, electrically conducting adhesive bonding, low-temperature pressure sintering with a silver paste or ultrasonic welding.

Apart from the ceramic substrates 3 and 4, which may be constructed, loaded and connected to the upper side 91 of the base plate 9 in a way similar to the ceramic substrates 3 and 4 described above, further ceramic substrates 6 are provided, likewise having a patterned upper metallization 61, as well as a (concealed) lower metallization, which may be connected to the upper side 91 of the base plate 9 by means of a fusion soldering layer, a diffusion soldering layer, an adhesive bonding layer or a silver sintering layer. The ceramic substrate 6 is loaded with a passive device 80, here an NTC temperature sensor by way of example. This temperature sensor has at least one metallization, with which it can be connected in an electrically conducting manner to the metallization 61, for example by fusion soldering, diffusion soldering, electrically conducting adhesive bonding or low-temperature pressure sintering with a silver paste.

Thermal isolation can be achieved between the power semiconductor chips of the rectifier circuit and the power semiconductor chips of the inverter circuit, so as to produce within the power semiconductor module a temperature gradient from the power semiconductor chips of the inverter circuit to the rectifier circuit. This allows the power semiconductor chips of the inverter circuit to be operated at barrier-layer temperatures (for example at 175° C. or at 200° C.) that are much higher than the barrier-layer temperatures (for example 125° C. or 150° C.) of the power semiconductor chips of the rectifier circuit.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor module for use in a converter, which has a rectifier circuit and an inverter circuit, comprising:
a housing;
a first power semiconductor chip, which is a component part of the rectifier circuit and has a first semiconductor body with an upper chip metallization and a lower chip metallization;
a second power semiconductor chip, which is a component part of the inverter circuit and has a second semiconductor body with an upper chip metallization and a lower chip metallization; and
at least one ceramic substrate;
wherein the first power semiconductor chip and the second power semiconductor chip are arranged in the housing;
wherein the upper chip metallization of the first power semiconductor chip is adjoined by an aluminum-based bonding wire with an aluminum fraction of at least 99% by weight aluminum;
wherein the upper chip metallization of the second power semiconductor chip is adjoined by a copper-based bonding wire with a copper fraction of at least 99% by weight copper; and
wherein the lower chip metallization of the first power semiconductor chip is adjoined directly by a fusion soldering layer or the lower chip metallization of the second power semiconductor chip is adjoined directly by one of the following: a silver-containing sintering layer; an adhesive bonding layer or a diffusion soldering layer.

2. The power semiconductor module as claimed in claim 1, wherein the lower metallization of the first power semiconductor chip has at least a first sub-layer with a thickness of more than 1 µm or more than 2 µm and contains more than 99% by weight of aluminum.

3. The power semiconductor module as claimed in claim 1, wherein the lower metallization of the first power semiconductor chip is connected to an upper metallization of a ceramic substrate by means of a fusion soldering layer.

4. The power semiconductor module as claimed in claim 1, wherein the lower metallization of the second power semiconductor chip has at least one first sub-layer with a thickness of more than 1 µm or more than 2 µm and contains more than 99% by weight of copper.

5. The power semiconductor module as claimed in claim 1, wherein the lower metallization of the second power semiconductor chip is connected to an upper metallization of a ceramic substrate by means of a diffusion soldering layer, an adhesive bonding layer or by means of a silver-containing sintering layer.

6. The power semiconductor module as claimed in claim 1, wherein the upper metallization of the first power semiconductor chip has at least one first sub-layer with a thickness of more than 1 µm or more than 2 µm and contains more than 99% by weight of aluminum.

7. The power semiconductor module as claimed in claim 6, wherein a bonding wire, which contains more than 99.9% by weight of aluminum, is bonded onto the upper metallization of the first power semiconductor chip.

8. The power semiconductor module as claimed in claim 7, wherein the bonding wire directly contacts the first sub-layer of the upper metallization of the first power semiconductor chip.

9. The power semiconductor module as claimed in claim 1, wherein the upper metallization of the second power semiconductor chip has at least one first sub-layer with a thickness of more than 1 µm or more than 2 µm and contains more than 99% by weight of copper.

10. The power semiconductor module as claimed in claim 9, wherein a bonding wire, which contains more than 99.9% by weight of copper, is bonded onto the upper metallization of the second power semiconductor chip.

11. The power semiconductor module as claimed in claim 9, wherein the bonding wire directly contacts the first sub-layer of the upper metallization of the second power semiconductor chip.

12. The power semiconductor module as claimed in claim 1, wherein each ceramic substrate of the at least one ceramic substrate on which at least one power semiconductor chip is arranged has on its side facing away from its upper metallization a lower metallization which forms the underside of the power semiconductor module, and wherein, in the case of a number of ceramic substrates, the lower metallizations of the ceramic substrates are spaced apart from one another.

13. The power semiconductor module as claimed in claim 1, further comprising a metallic base plate having an upper side and an underside, wherein the underside of the base plate forms at least part of the underside of the power semiconductor module, and wherein a lower metallization of each ceramic substrate of the at least one ceramic substrate on which at least one power semiconductor chip is arranged is firmly connected to the upper side of the base plate.

14. The power semiconductor module as claimed in claim 13, wherein the first power semiconductor chip is arranged on a first ceramic substrate of the at least one ceramic substrate, and wherein the first ceramic substrate is firmly connected at its lower metallization to the upper side of the base plate by means of a fusion soldering layer.

15. The power semiconductor module as claimed in claim 14, wherein the lower metallization of the first power semiconductor chip is firmly connected to an upper metallization of the first ceramic substrate by means of a fusion soldering layer.

16. The power semiconductor module as claimed in claim 15, wherein the second power semiconductor chip is arranged on a second ceramic substrate of the at least one ceramic substrate, and wherein the second ceramic substrate is firmly connected at its lower metallization to the upper side of the base plate by means of a diffusion soldering layer, an adhesive bonding layer or by means of a silver-containing sintering layer.

17. The power semiconductor module as claimed in claim 16, wherein the lower metallization of the second power semiconductor chip is firmly connected to the upper metallization of the second ceramic substrate by means of a diffusion soldering layer, an adhesive bonding layer or by means of a silver-containing sintering layer.

18. The power semiconductor module as claimed in claim 17, wherein the base plate has at least one first segment and a second segment, and wherein:

a first ceramic substrate, on which the first power semiconductor chip is arranged, is arranged on the first segment; and a second ceramic substrate, on which the second power semiconductor chip is arranged, is arranged on the second segment.

19. The power semiconductor module as claimed in claim 18, wherein the first segment and the second segment are formed in one piece and are connected to one another by means of one or more connecting webs.

20. The power semiconductor module as claimed in claim 18, wherein the first segment and the second segment are spaced apart from one another.

21. The power semiconductor module as claimed in claim 1, wherein all of the power semiconductor chips of the rectifier circuit are arranged on a first common ceramic substrate and are connected with their lower chip metallizations to an upper metallization of the first common ceramic substrate in each case by means of a fusion soldering layer.

22. The power semiconductor module as claimed in claim 21, wherein all of the power semiconductor chips of the inverter circuit are arranged on a second common ceramic substrate and are connected with their lower chip metallizations to an upper metallization of the second common ceramic substrate in each case by means of a diffusion soldering layer, an adhesive bonding layer or by means of a silver-containing sintering layer.

23. The power semiconductor module as claimed in claim 22, further comprising a third common ceramic substrate with an upper metallization, wherein:

the lower metallization of the first power semiconductor chip is connected to the upper metallization of the third common ceramic substrate by means of a fusion soldering layer; and the lower metallization of the second power semiconductor chip is connected to the upper metallization of the third common ceramic substrate by means of a silver-containing sintering layer, an adhesive bonding layer or by means of a diffusion soldering layer.

24. The power semiconductor module as claimed in claim 1, wherein all of the power semiconductor chips of the rectifier circuit that are arranged in the housing have an upper chip metallization and a lower chip metallization with an aluminum fraction of in each case more than 50% by weight, and wherein all of the power semiconductor chips of the inverter circuit that are arranged in the housing have an upper chip metallization and a lower chip metallization with a copper fraction of in each case more than 50% by weight.

25. The power semiconductor module as claimed in claim 24, wherein all of the power semiconductor chips of the rectifier circuit are spatially arranged in a first group and all of the power semiconductor chips of the inverter circuit are spatially arranged in a second group on a common ceramic substrate, and wherein a smallest distance between a power semiconductor chip of the first group and a power semiconductor chip of the second group is greater than 5 mm or greater than 10 mm.

* * * * *